United States Patent [19]

Bright et al.

[11] Patent Number: 4,969,828
[45] Date of Patent: Nov. 13, 1990

[54] ELECTRICAL SOCKET FOR TAB IC'S

[75] Inventors: Edward J. Bright, Middletown; John J. Consoli, Harrisburg; Attalee S. Taylor, Palmyra, all of Pa.

[73] Assignee: AMP Incorporated, Harrisburg, Pa.

[21] Appl. No.: 463,859

[22] Filed: Jan. 12, 1990

Related U.S. Application Data

[63] Continuation-in-part of Ser. No. 353,287, May 17, 1989, abandoned.

[51] Int. Cl.$^5$ ............................................. H01R 9/09
[52] U.S. Cl. ....................................... 439/68; 439/73; 439/248; 439/493
[58] Field of Search ........................ 439/67, 68, 70–73, 439/75, 77, 247, 248, 492, 493

[56] References Cited

U.S. PATENT DOCUMENTS

| | | | |
|---|---|---|---|
| 4,125,310 | 12/1975 | Reardon et al. | 339/92 M |
| 4,411,719 | 10/1983 | Lindberg | 156/64 |
| 4,453,795 | 6/1984 | Moulin | 339/92 M |
| 4,560,216 | 12/1985 | Egawa | 439/68 |
| 4,696,526 | 9/1987 | Newton et al. | 439/68 |
| 4,713,611 | 12/1987 | Solstad et al. | 324/158 F |
| 4,758,176 | 7/1988 | Abe et al. | 439/73 |
| 4,772,936 | 9/1988 | Reding et al. | 174/52 FP |
| 4,783,719 | 11/1988 | Jamison et al. | 439/68 |

FOREIGN PATENT DOCUMENTS 0310302 9/1988 European Pat. Off. .
1252769 10/1967 Fed. Rep. of Germany ........ 439/68

OTHER PUBLICATIONS

IBM Technical Disclosure Bulletin "Film Supported Probe for the AC Pulse Testing of Integrated Circuits", vol. 10, Mar. 1968.

Primary Examiner—Paula A. Bradley
Attorney, Agent, or Firm—Allan B. Osborne

[57] ABSTRACT

An electrical socket for TAB ICs. More particularly, the socket includes a flexible etched film having an array of traces thereon, a base on which the film is positioned to receive a TAB IC thereover and a cover having a pressure plate for biasing the IC against the film to provide an electrical connection between respective traces on the IC and on the film.

10 Claims, 8 Drawing Sheets

ELECTRICAL SOCKET FOR TAB IC'S

This application is a continuation in part of application Ser. No. 353,287 filed May 17, 1989, now abandoned.

FIELD OF THE INVENTION

The present invention relates to electrical sockets for integrated circuits (IC) mounted on tape by automated bonding, a process and product known by the acronym "TAB", and packaged into a carrier assembly. The sockets are used to electrically connect the TAB IC to circuit boards for ordinary use as well as for testing and burning in of ICs.

BACKGROUND OF THE INVENTION

U.S. Pat. No. 4,713,611 discloses an apparatus for burn-in testing of multiple ICs mounted on carrier tape by the TAB process without having to remove the chips from the tape. A plurality of ICs on a strip of tape is wrapped over a pair of back to back printed-circuit boards (PCB) with the leads from the tape engaging respective contact arrays on the PCBs. The tape and ICs are held in position by hinged covers which include dielectric pressure pads or ribs to press the tape leads against the contact arrays. The apparatus further includes an electrical connection assembly providing an electrical link between the contact arrays on the PCBs and test equipment outside the oven.

While several ICs on tape can be tested simultaneously in one of the test apparatus described above, it is clear that the loading and unloading must be done manually which takes time and requires semi-skilled workers. It is therefore desirable to provide a burn-in socket which although limited to receiving a single IC on tape, can be loaded, tested and unloaded robotically. It is also desirable to provide a socket for TAB ICs for general use; e.g., in computers and like electronic equipment.

SUMMARY OF THE INVENTION

According to the present invention an electrical socket is provided for use with TAB ICs. The socket includes a base having a surface for receiving a flexible etched film, having conductive traces thereon with inner ends being arranged in a predetermined pattern around a central portion thereof and outer ends adjacent respective edges of the film, and a cover pivotally attached to the base and having a pressure plate therein to bias traces on a TAB tape against respective inner ends of the traces on the film to achieve an electrical connection therebetween.

DESCRIPTION OF THE INVENTION

Figure 1:
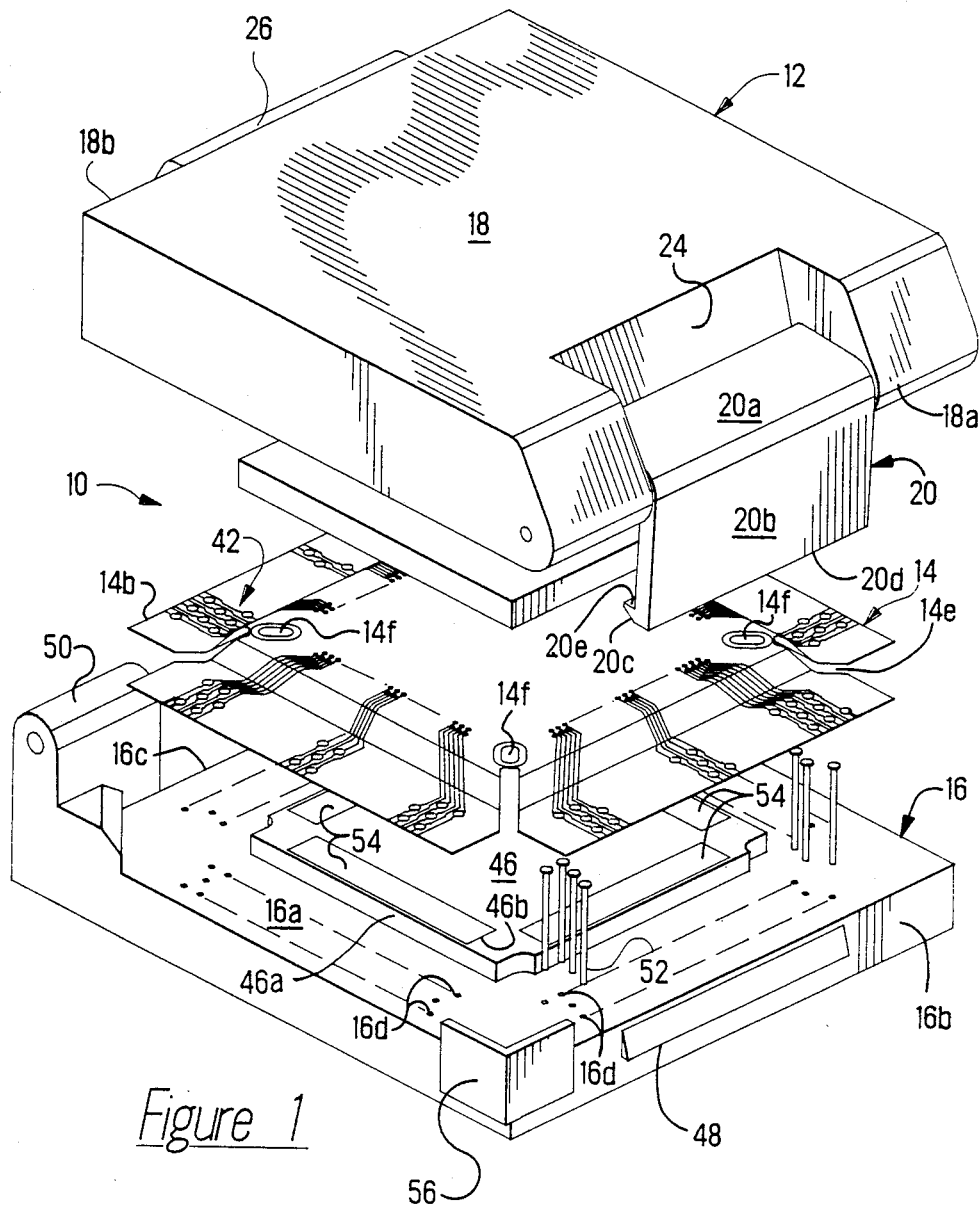
FIG. 1 is an exploded perspective view of a socket constructed in accordance with the preferred embodiment of the present invention.
Figure 2:
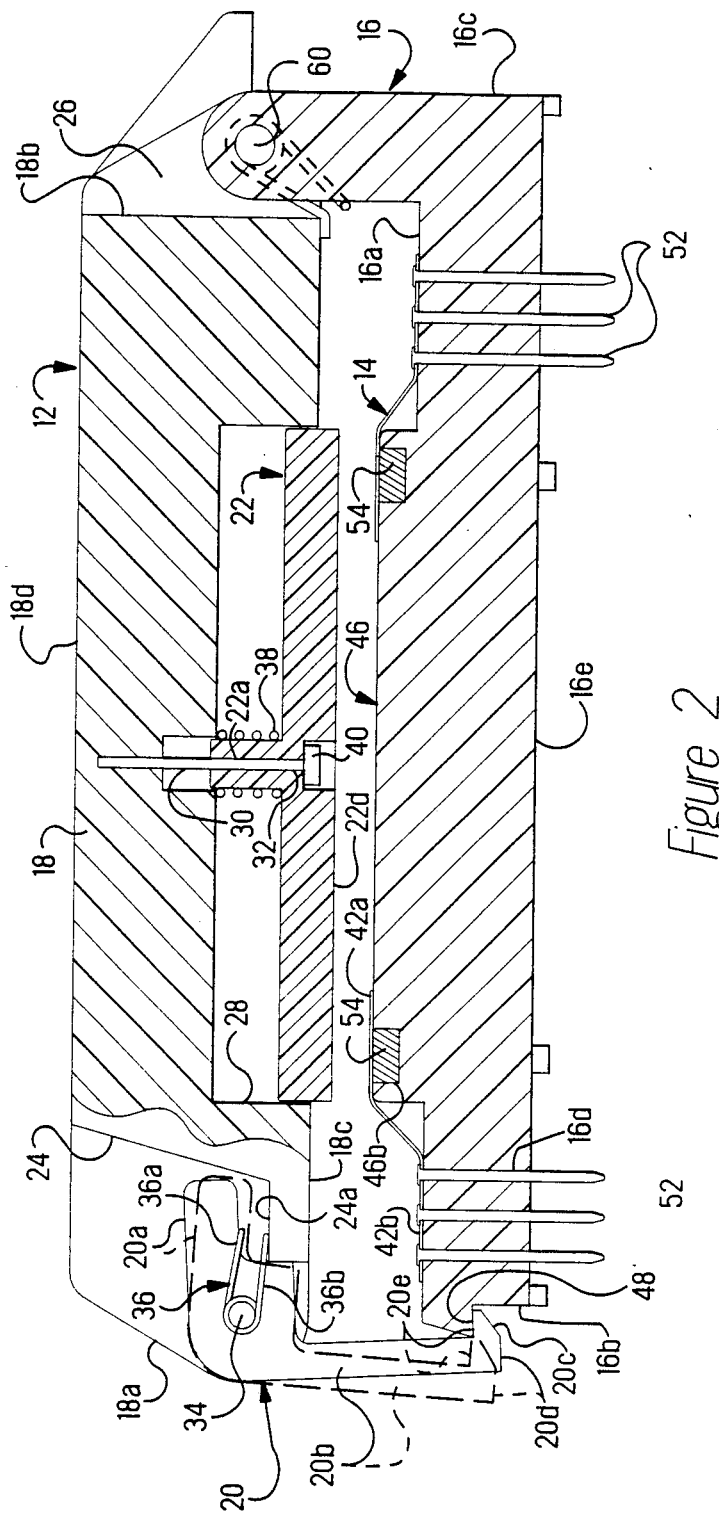
FIG. 2 is a cross sectional view of the socket as assembled.

Socket 10, constructed in accordance with the best mode known at this time, is shown in FIG. 1 in exploded fashion and assembled in FIG. 2. The major components of socket 10 are cover 12, flexible etched circuitry film 14, and base 16.

Cover 12 includes member 18, latch 20 and spring loaded pressure plate 22.

Member 18 is provided with recess 24 in one end 18a and hinge block 26 projecting outwardly from opposite end 18b. As shown in FIG. 2, recess 28 and aperture 30 are provided in underside 18c. Hole 32 intersects aperture 30 from top side 18d.

Latch 20 is pivotally attached to member 18 within recess 24 by pivot pin 34. Latch 20 is L-shaped with short arm 20a projecting into recess 24 and long arm 20b extending away from underside 18c. Hook 20c located on free end 20d of arm 20b provides shoulder 20e.

Latch 20 is biased by torsion spring 36 which is wrapped around pivot pin 34 and with free ends 36a, 36b bearing against short arm 20a and ledge 24a, located within recess 24, respectively.

Pressure plate 22 includes projecting stud 22a on top side 22b, and coil spring 38 over stud 22a. As shown in FIG. 2, plate 22 is slidingly positioned in recess 28 with stud 22a being received in aperture 30. A bolt 40, slidingly mounted in hole 32, retains plate 22 in recess 28 while spring 38 biases plate 22 outwardly from recess 28.

Figure 3:
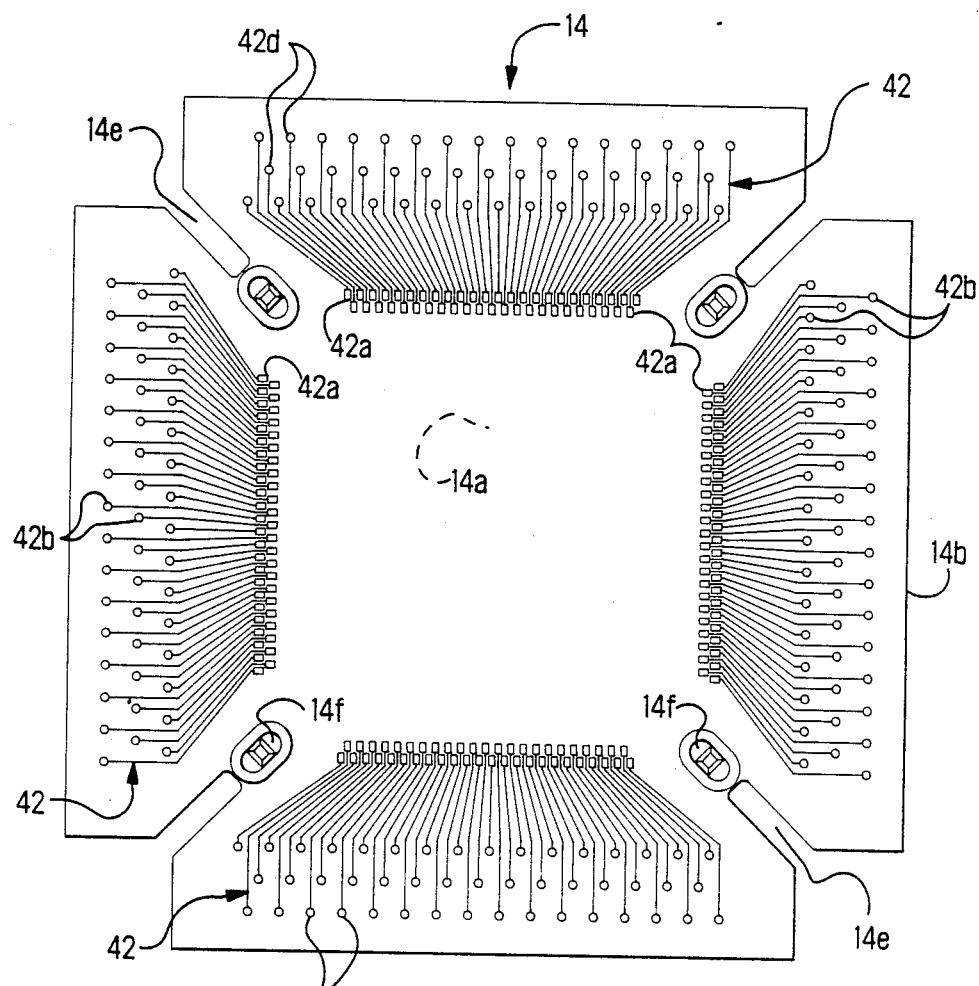
FIG. 3 is a plan view of the flexible etched film of the socket
Figure 6:
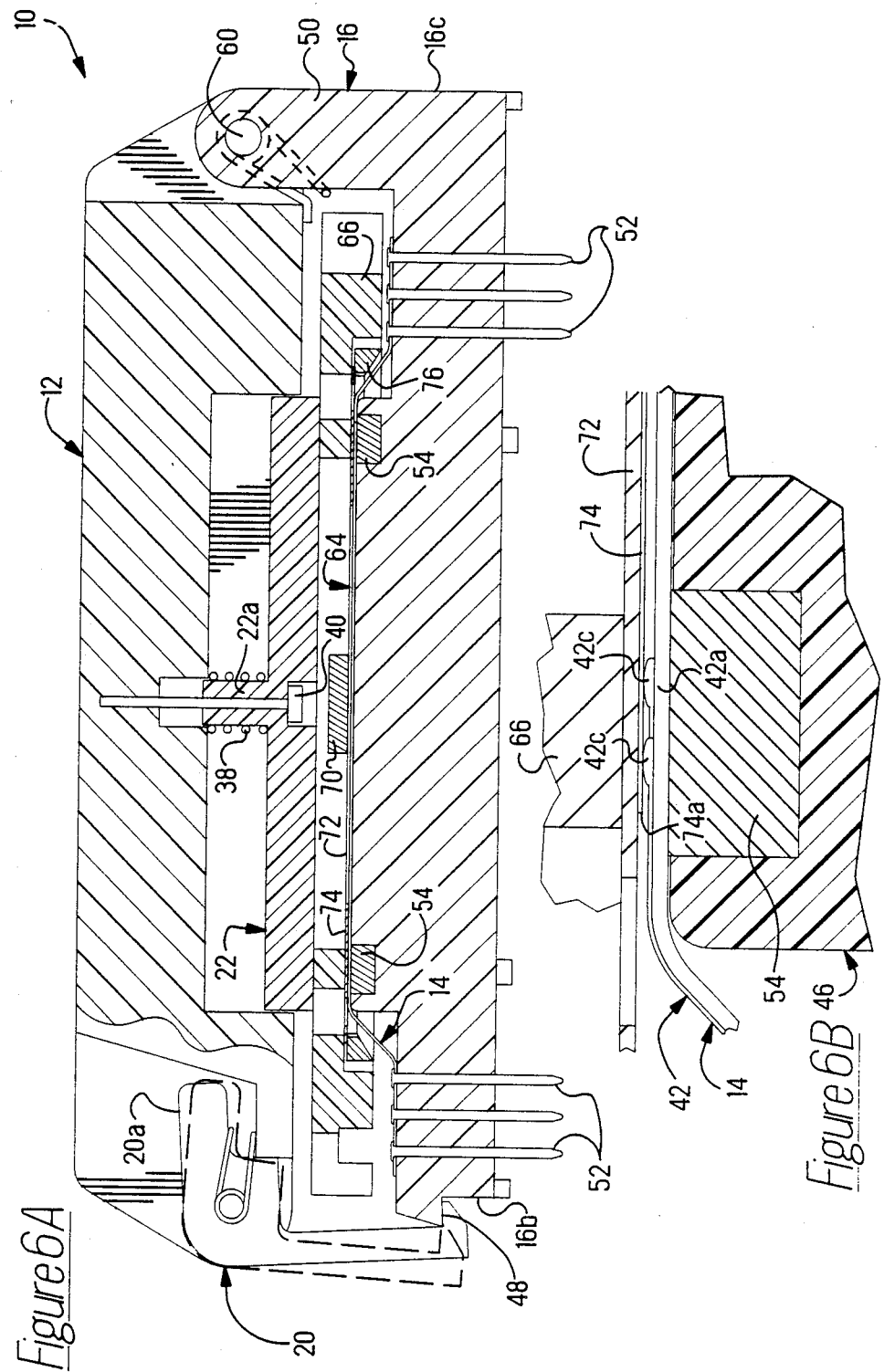
FIG. 6A cross sectional view of a closed socket with TAB IC Carrier Assembly therein.
FIG. 6B is an enlarged view of the contact between a trace on the film and a trace on the TAB tape.

Flexible etched circuitry film 14, shown also in FIG. 3, may have two copper layers with one layer being a ground plane (not shown) and the second layer having an array of conductive traces 42. Inner ends 42a of traces 42 are near an optional central opening 14a, indicated by dashed lines and outer ends 42b are at or near edges 14b of film 14. As shown in FIG. 6B, inner ends 42a of traces 42 included raised, gold-plated bumps 42c. Outer ends 42b are provided with holes 42d. Each corner of film 14 is slotted as indicated by reference numeral 14e and further, keying holes 14f are provided adjacent the terminus of slots 14e.

Base 16 of socket 10 includes raised platform 46 centrally located on top side 16a, a downwardly-facing shoulder 48 on front edge 16b and outwardly projecting hinge ears 50 on each end of rear edge 16c. Further included are pins 52 which are disposed in holes 16d which open out on underside 16e of base 16.

Platform 46 is provided with resilient pads 54 extending along each edge 46a. As shown in FIGS. 1 and 2, pads 54 are positioned in upwardly open grooves 46b.

Base 16 may also have various polarizing devices; e.g., corner walls 56.

Cover 12, latch 20 and base 16 are molded with the preferred material being polyethersulfone.

Socket 10 is assembled by placing film 14 over platform 46 of base 16 with the film edges 14b extending onto top side 16a. Pins 52 are pushed through respective holes 42d in the traces outer ends 42b and through holes 16d in base 16 to extend outwardly from underside 16e as shown in FIG. 2. Traces 42 extend onto platform 46 with gold plated bumps 42c being over resilient pads 54.

Cover 12 is pivotally mounted onto base 16 with hinge pins 60 extending through hinge ears 50 and hinge block 26. Pressure plate 22 is then in registration with platform 46. Latch 20 extends in front of front edge 16b of base 16 so that hook 20c is received under shoulder 48 to removably secure cover 12 to base 16.

In use, socket 10 is mounted on a test board (not shown) with pins 52 being soldered in plated through holes (not shown) on the board.

Figure 4:
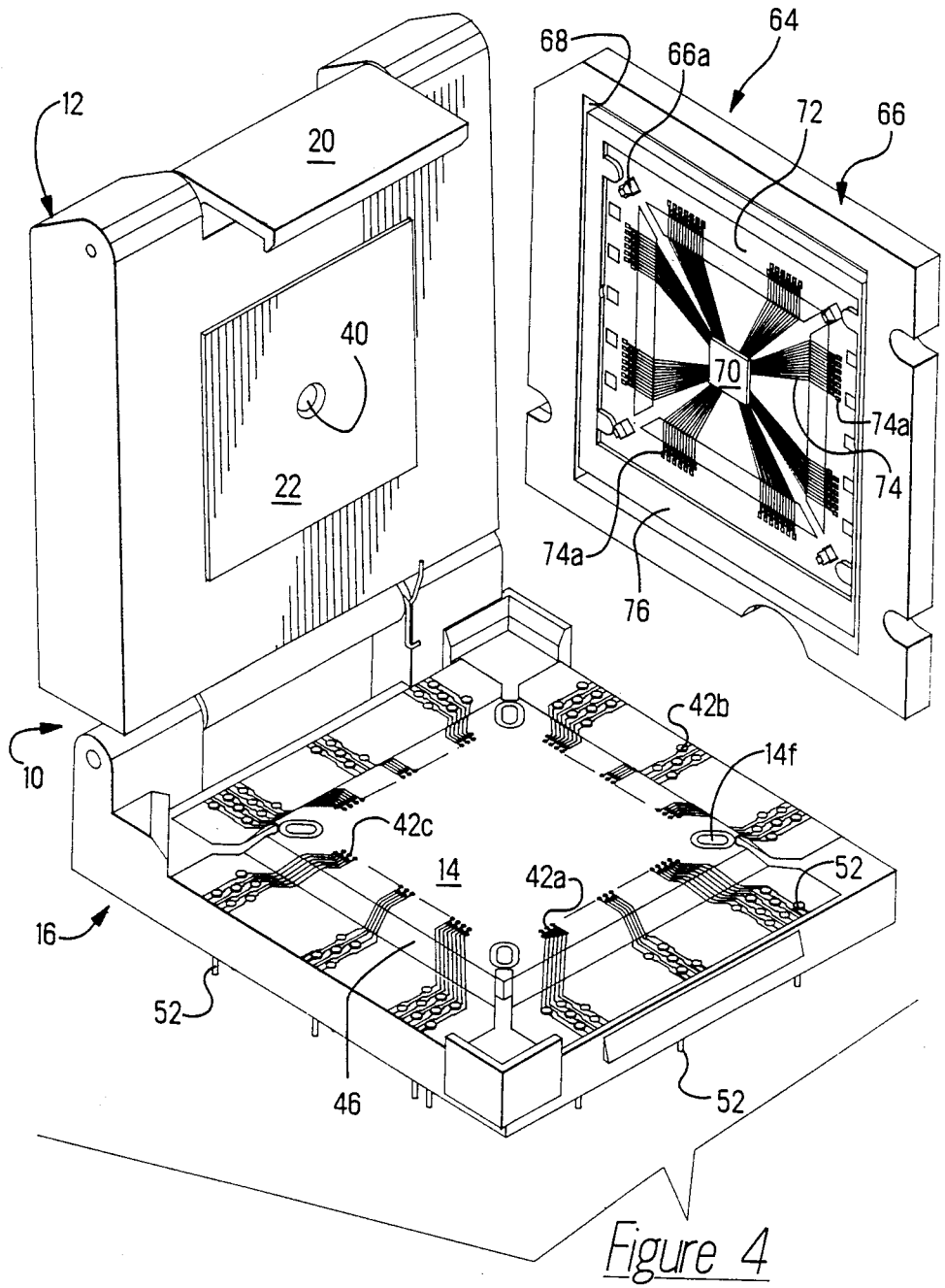
FIG. 4 is a perspective view of the assembled, open socket and a TAB IC carrier assembly.

FIG. 4 shows open socket 10 and a Tab IC Carrier assembly 64, which is tested therein. Assembly 64 includes a base 66 having a recess 68 in one surface in which the IC chip 70 mounted on film 72, is positioned. Traces 74 and outer trace ends 74a on film 72 are on patterns corresponding to th trace pattern on film 14 in socket 10. Frame 76 secures film 72 in recess 68 in base 66.

Assembly 66 is placed onto base 16 so that the outer ends 74a of traces 74 engage bumps 42c on traces 42 on platform 46. Alignment pegs 66a on assembly base 66 enter keying holes 14f in film 14. Although not shown, holes may be positioned in platform 46 in alignment with film holes 14f to receive pegs 66a which may extend therethrough and assure proper alignment of film bumps to tape 72 and especially to trace ends 74a.

Figure 5:
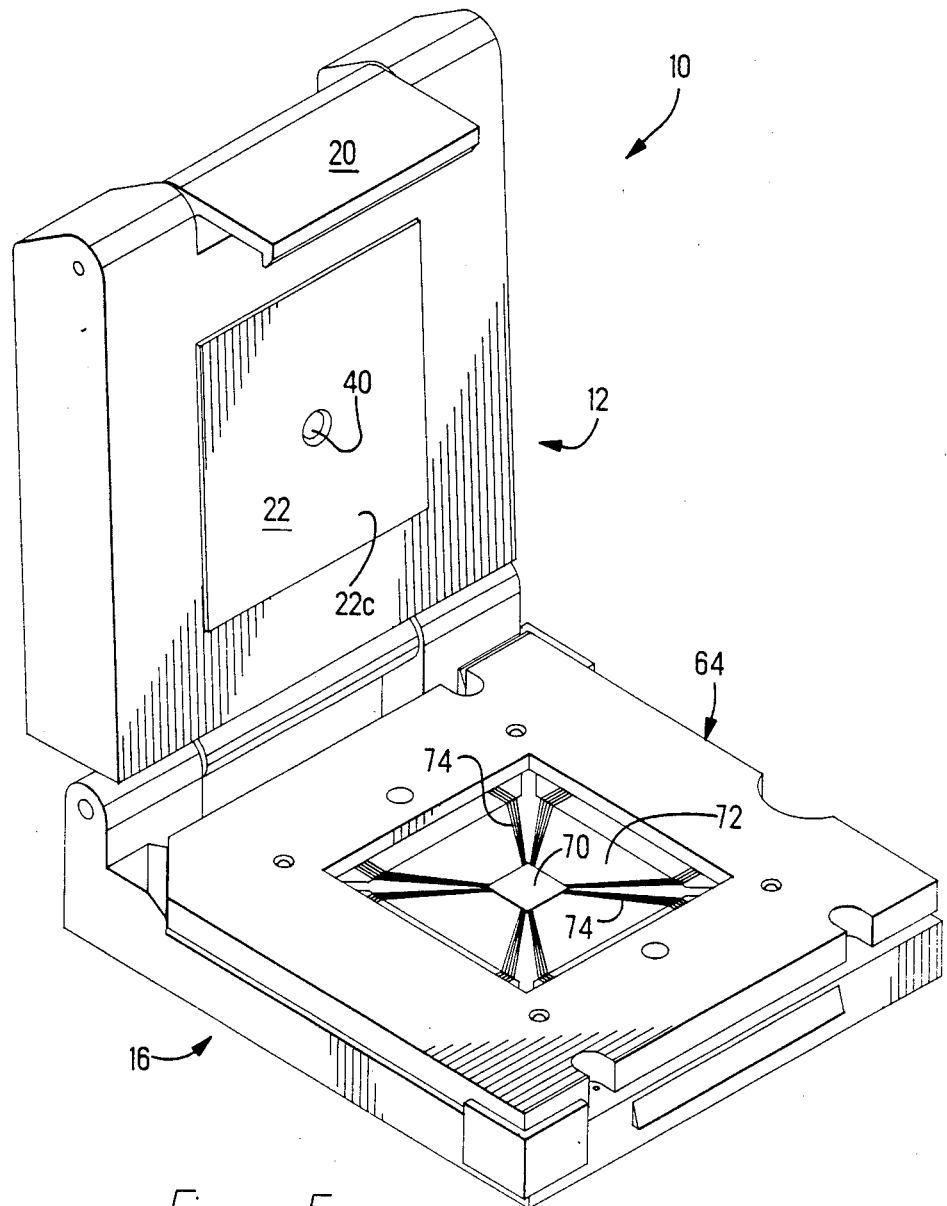
FIG. 5 is a perspective view showing the open socket with the TAB IC positioned therein.

FIG. 5 shows assembly 64 in open socket 10 and FIG. 6A shows assembly 64 in a closed socket 10. In closing cover 12, pressure plate 22 therein engages the outer surface of assembly 66 which bears against outer trace ends 74a of traces 74 and bias them against bumps 42c on inner ends 42a of traces 42. FIG. 6B is an enlarged view of this mating. Resilient pads 54 absorbs any non-complanarity conditions.

Socket 10 is well suited for robotic use. That is, a test board (not shown) may be filled with sockets 10 which can be opened by robot arms (not shown) loaded with assemblies 64 by vacuum pick-up devices (not shown), closed by rollers or the like (not shown) sweeping across the board, moving the board into and out of the test oven, reopening sockets 10, retrieving the tested assemblies 64 and beginning the sequence over again. For robotic use, cover 12 would be spring-loaded to open fully upon withdrawing hook 20c from shoulder 48. Without such a spring arrangement (not shown) pressure plate 22 will cause cover 12 to open slightly to enable a user to more easily open cover 12 completely.

Socket 10 is also well suited for use in burn-in tests in having temperature capability of at least 150°centigrade.

Other features of the present invention include the ability of socket 10 to accept ICs on tape having different trace configurations simply by changing to another film 14 with the required trace pattern. The single pressure plate 22 also assures uniform contact normal forces.

Socket 10 has particular use in burn-in testing of TAB ICs. However, socket 10 is equally well suited to electrically interconnect TAB ICs to circuit boards in ordinary usage; e.g., in electronic equipment.

Alternative embodiments would include a socket 10 wherein pins 52 are replaced with other means for terminating traces 42 to the test board. For example, film 14 itself could extend beyond socket 10 and be electrically connected directly to circuits on the board or to the test equipment.

Figure 7:
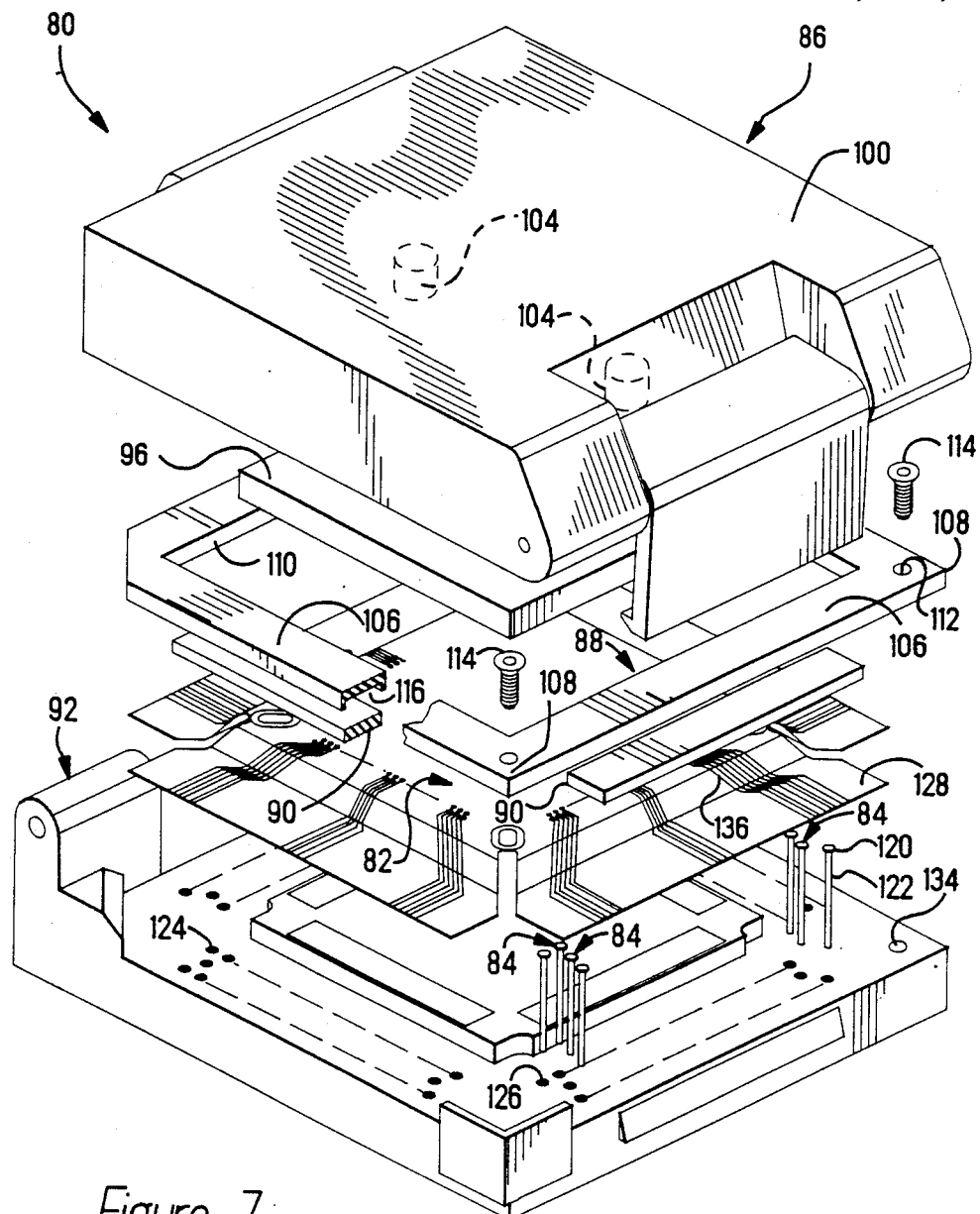
FIG. 7 is an exploded view of a socket constructed in accordance with another embodiment of the present invention.
Figure 8:
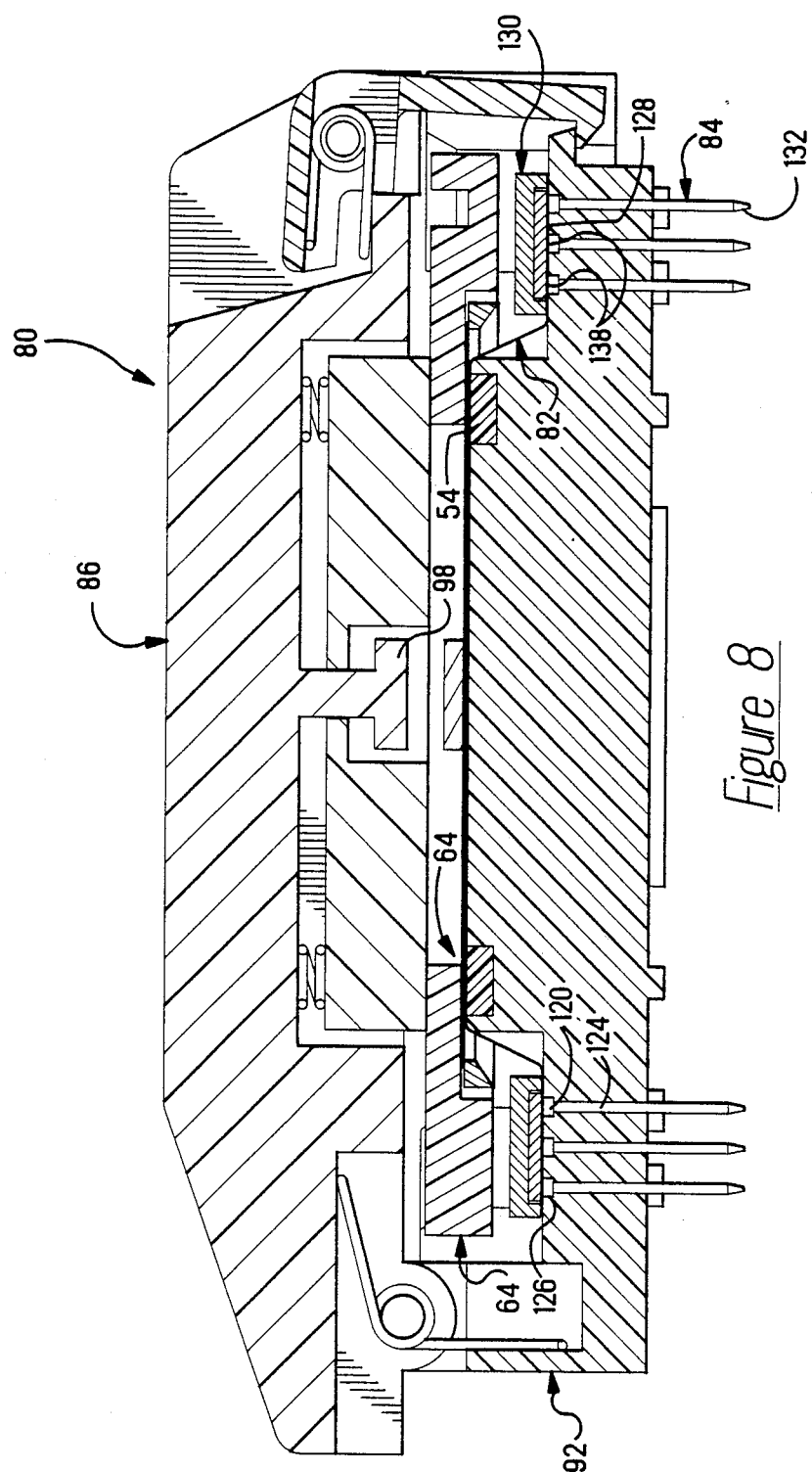
FIG. 8 is a side sectioned view of the socket of FIG. 7.

Socket 80 shown in FIGS. 7 and 8 discloses an alternative method of electrically connecting flexible etched circuitry film 82 to a circuit board (not shown) through pins 84. As will be recalled, film 14 of socket 10 includes a plurality of holes 42d through which pins 52 were pushed. In addition to electrically connecting traces 42 to the circuit board, the pins 52 also held film 14 to base 16.

As shown in FIG. 7, the components of socket 80 include cover 86, frame 88, resilient pads 90, the aforementioned film 82, pins 84 and base 92.

Cover 86 differs slightly from cover 12 in that pressure plate 96 is movably attached to retaining member 98 (FIG. 8) which is an integrally molded part of member 100 and that pressure plate 96 is biased downwardly by a plurality of coil springs 104 spaced adjacent the perimeter of plate 96.

Frame 88 includes four side rails 106 attached at the respective corners 108 to define center opening 110. Holes 112 are provided at corners 108 to receive mounting screws 114. Grooves 116 are provided in the under surface of each side rail 106. Frame 88 is preferably molded from a plastics material such as liquid crystal polymer.

Resilient pads 90 are preferably made from a material such as silicone rubber.

Conductive pins 84 include head 120 and shaft 122. Preferably, pins 84 are made from a copper alloy.

Base 92 is substantially the same as base 16 with the significant difference being in that holes 124 which receive pins 84 include counterbores 126. Further, holes 134 are provided for receiving screws 114.

Film 82 differs with respect to film 14 in that the traces 136 on film 82 are not provided with holes but rather contact pads 138 (FIG. 8) which are located on the undersurface of edges 128.

In assembly socket 80, frame 88 and pads 90 may be combined into a sub unit, indicated by reference numeral 130 in FIG. 8, by securing pads 90 in grooves 116, preferably by an interference fit although an adhesive may be used.

With reference to FIG. 8, pins 84 are pushed into holes 124 in base 92 with the free ends 132 of shafts 122 extending outwardly for insertion into a back plane (not shown). Heads 120 are positioned in counter bores 126 and film 82 laid over base 92 so that the contact surfaces (not shown) are in electrical engagement with heads 120. Sub unit 130 is placed over heads 120 with film edges 128 therebetween as shown. Screws 114 secures sub unit 130 to base 92 and in so doing pushes the contact surfaces (not shown) on film edges 128 against heads 120 to provide a compressional force for an enhanced electrical contact.

The obvious advantage of socket 80 is that film 82 may be readily replaced.

As can be discerned, a socket for TAB ICs has been disclosed. The socket includes a flexible etched film with traces arranged so that the inner ends correspond to the pattern of traces on the IC tape. The film is positioned on socket base to which a cover is hingedly mounted to bias the tape traces against respective film traces to establish electrical paths between the IC and test equipment. The socket film may be easily replaced with other film having different trace patterns to enable the socket to accept other TAB ICs.

What we claim is:

1. An electrical socket for sue with TAB ICs comprising
    a base having a first surface including a raised platform for receiving a flexible film;

grooves provided in said platform with resilient pads disposed therein;

a flexible film having an array of conductive traces thereon, said traces including inner ends arranged in a predetermined pattern around a central portion of said film and outer ends at or near respective edges of said film, said film being mounted on said first surface of said base; and a cover hingedly mounted to said base and having a pressure plate movably mounted on a surface of said cover facing said first surface of said base and biased outwardly therefrom for biasing a TAB IC carrier assembly which may be placed in said socket against said film.

2. The socket of claim 1 wherein said resilient pads are under said inner ends of said traces.

3. The socket of claim 1 wherein said outer ends of said traces are located on said first surface but not on said platform.

4. The socket of claim 1 further including means for terminating said outer ends of said traces to electrical components.

5. The socket of claim 4 wherein said electrical components include a circuit board on which said socket may be mounted.

6. The socket of claim 1 further including cooperating latch means on said base and said cover for releasably latching said base and cover together.

7. The socket of claim 6 wherein said latch means may be robotically operated.

8. The socket of claim 1 further including registration means in said film and said platform for receiving fiduciary pins projecting outwardly form a TAB IC carrier assembly which may be placed in said socket.

9. The socket of claim 8 wherein said registration means include oval shaped holes with a major axis being at an oblique angle relative to a given side of said first surface.

10. The socket of claim 9 wherein said oblique angle includes an angle of forty five degrees.

* * * * *

UNITED STATES PATENT OFFICE
CERTIFICATE OF CORRECTION

Patent No. 4,969,828  Dated November 13, 1990

Inventor(s) Edward J. Bright, John J. Consoli, Attalee Taylor

It is certified that error appears in the above-identified patent and that said Letters Patent is hereby corrected as shown below:

In the Claims

Claim 1, Column 4, Line 65 - the word "sue" should be --use--.

Claim 8, Column 6, Line 14 - the word "form" should be --from--.

Signed and Sealed this

Nineteenth Day of May, 1992

Attest:

DOUGLAS B. COMER

*Attesting Officer*  *Acting Commissioner of Patents and Trademarks*